(12) United States Patent
Barnfield et al.

(10) Patent No.: US 7,516,424 B2
(45) Date of Patent: Apr. 7, 2009

(54) MODELING AND SIMULATING A POWERGATED HIERARCHICAL ELEMENT

(75) Inventors: Stephen J. Barnfield, New York, NY (US); Subhrajit Bhattacharya, White Plains, NY (US); Daniel R. Knebel, Mahopac, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 11/358,456

(22) Filed: Feb. 21, 2006

(65) Prior Publication Data

US 2007/0198237 A1     Aug. 23, 2007

(51) Int. Cl.
*G06F 17/50*     (2006.01)
(52) U.S. Cl. .............................. 716/1; 716/4
(58) Field of Classification Search ............... 716/1, 716/4, 5, 7, 10; 703/13; 326/33
See application file for complete search history.

(56) References Cited

U.S. PATENT DOCUMENTS

| | | | |
|---|---|---|---|
| 6,820,240 B2* | 11/2004 | Bednar et al. .................. 716/1 |
| 6,883,152 B2* | 4/2005 | Bednar et al. .................. 716/5 |
| 7,057,866 B2* | 6/2006 | Hsu et al. ...................... 361/18 |
| 7,126,370 B2* | 10/2006 | Bhattacharya ................ 326/33 |
| 7,180,363 B2* | 2/2007 | Parris et al. .................. 327/544 |

* cited by examiner

*Primary Examiner*—Vuthe Siek
(74) *Attorney, Agent, or Firm*—Brian Verminski; Hoffman Warnick LLC (57) ABSTRACT

A method, system and computer program product for modeling and simulating a powergated hierarchical element of an integrated circuit is disclosed. In modeling a powergated macro, the invention does not model all logic gates or elements as powergated, instead, the invention only models latches as connected to an integrated switch to be powergated. In addition, a fence circuit attached to the powergated macro is modeled as including an extra control signal to force a powergated state of the powergated macro into the fence circuit.

7 Claims, 13 Drawing Sheets

```
signal A, B: std_ulogic;
signal C: std_ulogic;
signal D, E: std_ulogic;

If clk and clk'event then
  If (A < B) then
    C_in <= D ⊕ 1;
  else
    C_in <= E;
  end if;

lat1: latch port map (C_in, clk, C);

to_mac250 <= f(A, B);
to_mac260 <= C;
```

```
signal A, B: std_ulogic;
signal C: std_ulogic;
signal D, E: std_ulogic;

foot: footer port map (sleep_n, vgnd, gnd!);
If clk and clk'event then
  If (A < B) then
    C_in <= D ⊕ 1;
  else
    C_in <= E;
  end if;
lat1: latch port map (vgnd, C_in, clk, C);

fOut <= f(A, B);
f0_0: fence0 port map (fOut, fnc_en, vgnd, to_mac250);
to_mac260 <= C;
```

MODELING AND SIMULATING A POWERGATED HIERARCHICAL ELEMENT

FIELD OF THE INVENTION

The invention relates generally to the design of an integrated circuit, and more particularly to modeling and simulating a powergated hierarchical element of an integrated circuit.

BACKGROUND OF THE INVENTION

Increased power dissipation is becoming a major challenge in the design of integrated circuits, because it causes numerous problems including reduced battery life in mobile systems, expensive packaging and cooling solutions, and potential chip failures. Among the various factors contributing to power dissipation, leakage (or static power) dissipation becomes increasingly important with technology scaling and is predicted to surpass dynamic power dissipation at around the 65 nm technology node.

Efforts have been made to investigate various methods for reducing and controlling leakage dissipation in circuits. Powergating is a highly effective technique which uses integrated switches, e.g., NFET and PFET, to cut off the leakage paths between the power supply terminals in an idle state to reduce significant leakage. Researches have been done at the level of circuit implementation required to achieve efficient powergating solutions.

Figure 1:
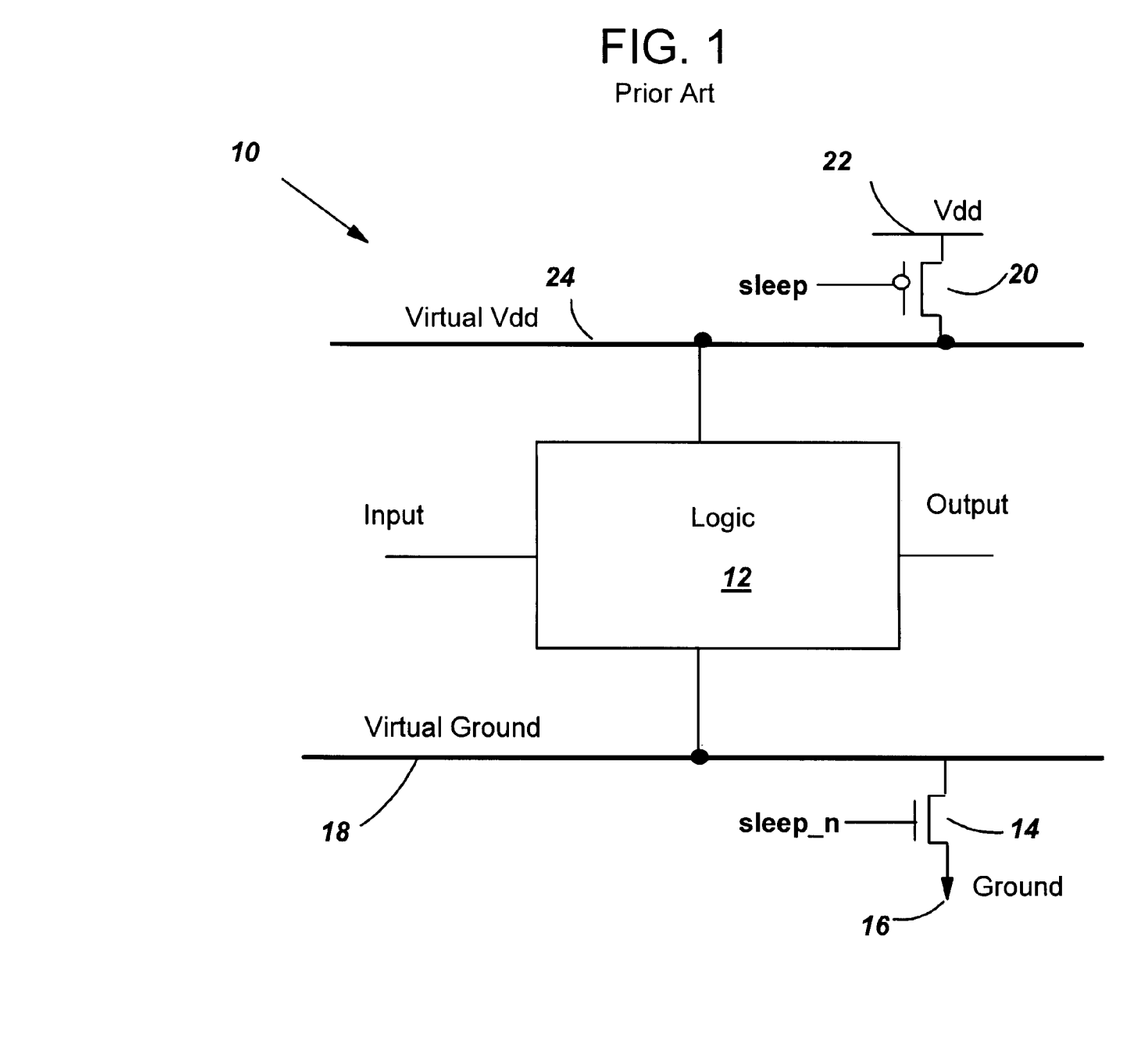
FIG. 1 shows a schematic view of a powergating implementation according to prior art.

For example, FIG. 1 shows a schematic view of a powergating implementation 10 of a powergated logic 12. In FIG. 1, the powergating is implemented by placing an NFET 14 (also called a footer) between the ground terminal of logic 12 and chip ground 16. The net connecting the ground terminals of powergated logic 12 and the drain of the NFET 14 is named as a virtual ground (vgnd) 18. When NFET 14 is turned off by its control signal "sleep_n", leakage through logic 12 is reduced. A similar effect can be achieved by using a PFET 20 (or a header) between chip Vdd supply 22 and the Vdd terminal of logic 12. A drain terminal of header 22 is named a virtual power 14.

Figure 2:
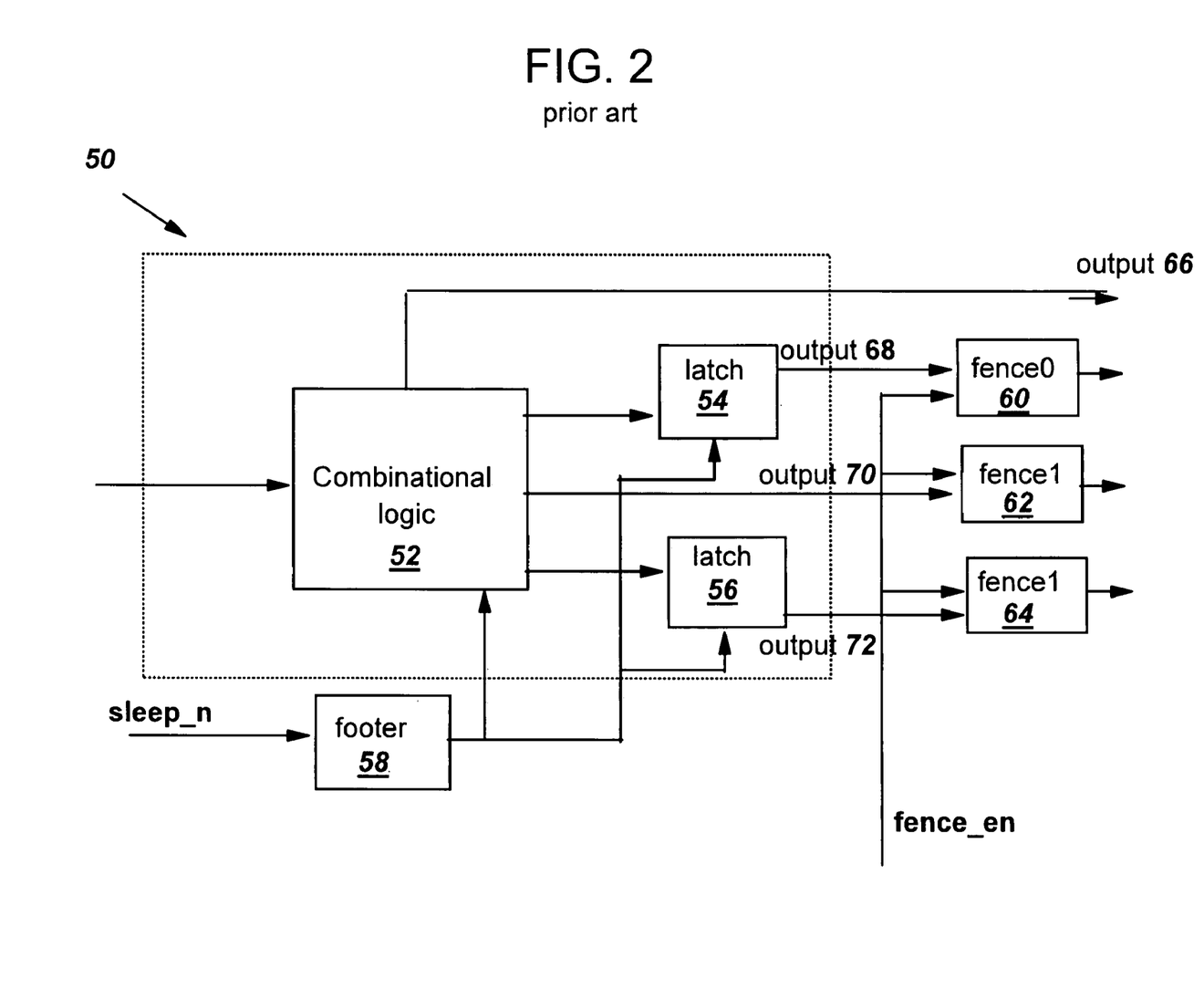
FIG. 2 shows a schematic view of a powergated macro according to prior art.

FIG. 2 shows a schematic view of a powergated macro 50. Macro 50 includes a combinational logic block 52 and latches 54 and 56. The outputs of combinational logic 52 may be fed into latches 54 and 56 to produce outputs of macro 50 (68 and 72), or may become outputs of macro 50 directly (66 and 70). Outputs of the macro may be fed into fence circuits 60, 62 and 64 that are attached to powergated macro 50. Typically, latch outputs (68 or 72) may also be fed back to the input of combinational logic 52. Here, the feedback loop is eliminated here for simplicity. In a powergated macro (50), typically there will be multiple small footer elements all tied in parallel between a virtual ground and a chip ground while ground terminals of all logic gates and latches will be tied to the virtual ground. These footers are shown as a single footer 58 in FIG. 2. Footer 58 is controlled by a sleep signal "sleep_n" similar to the configuration shown in FIG. 1. The output of footer 58 controls the ground terminals of combinational logic block 52 and latches 54 and 56 in macro 50. When powergating is activated by control signal "sleep_n", footer 58 is turned off, which causes the outputs of combinational logic 52 to float, and causes latches 54 and 56 to lose state. As a consequence, in the powergated state, macro outputs (66, 68, 70 and 72) will tend to float, i.e. the voltage at the output will neither be close to power supply Vdd (not shown), nor will it be close to 0 volts, rather it may be in-between and close to Vdd/2. If such floating macro outputs are inputs into gates in a non-powergated macro, then the gates of the non-powergated macro may leak heavily. It is also possible that a non-powergated element will malfunction if the input is floating or in an indeterminate state. To prevent such problems during powergating, outputs 68, 70 and 72 of powergated macro 50 are fed into fence circuits 60, 62 and 64. In FIG. 2. Fence 60 forces a "0" state (febce0) at the outputs when the control "fence_en" is activated and fence 62 and 64 force states "1" (fence1) at the outputs. Fence circuits 60, 62 and 64 are controlled by a fence enable "fence_en" signal which is used to turn the fence functions on and off. When a fence (60, 62, or 64) is disabled or turned off, the value at the fence output is the same as the value at the fence input. When a fence is enabled, a fence0 (60) will have a "0" at the output regardless of the input, while a fence1 (62 and 64) will have a "1" at the output. It should be noted that in FIG. 2, there is no fence circuit at output 66, since output 66 goes to another simultaneously powergated macro (not shown), which requires no fence circuit.

Register-transfer level (RTL) modeling of powergated logic, like those shown in FIG. 2, is essential to simulate and verify that a hierarchical element including a powergated logic works properly. When a logic is powergated, the footer, for example, is connected to the ground pin of every logic element. So one approach to modeling powergating at the RTL level is to instantiate a footer, for example, in the RTL model, and to instantiate all the logics as structural elements (gates, latches), and connect the footer to the ground pin of these structural elements. Such a model is referred to as a detailed modeling style, for illustrative purpose. There are several drawbacks of this detailed modeling style as listed below:

(a) the detailed modeling style models the structural as opposed to the behavioral characteristic of a powergated macro, which reduces design productivity and makes it difficult to understand and code;

(b) typically, VHDL (a language usually used for simulating an integrated circuit) libraries of gates do not have power ports corresponding to the Vdd and Gnd pins of the gates in a gate-level or a transistor level implementation (i.e., structural characteristic), so that in a detailed model, all the gates in the VHDL library are require to add extra power pins, which increases complexity of the library and the VHDL description of the macro; and (c) The simulation time for a detailed model is quite high compared to models that do not include power terminals such as Vdd or Gnd on every logic element.

Based on the above, there is a need to model a powergated macro (or logic) in a behavioral style. There is also a need to model a powergated macro (or logic) in a manner that makes the coding easier using the existing simulation languages such as VHDL.

BRIEF SUMMARY OF THE INVENTION

A method, system and computer program product for modeling and simulating a powergated hierarchical element of an integrated circuit is disclosed. In modeling a powergated macro, the invention does not model all logic gates or elements as powergated, instead, the invention only models latches as connected to an integrated switch to be powergated. In addition, a fence circuit attached to the powergated macro is modeled as including an extra control signal to force a powergated state of the powergated macro into the fence circuit.

A first aspect of the invention is directed to a method for modeling and simulating a powergated hierarchical element of an integrated circuit, comprising: modeling only a latch of the powergated macro as being powergated through an integrated switch; and modeling a first fence circuit that includes a first fence control signal and is attached to the powergated macro as including a second different fence control signal.

A second aspect of the invention is directed to a system for modeling and simulating a powergated hierarchical element of an integrated circuit, the system comprising: a latch modeler for modeling only a latch of the powergated macro as being powergated through an integrated switch; and a fence circuit modeler modeling a first fence circuit that includes a first fence control signal and is attached to the powergated macro as including a second different fence control signal.

A third aspect of the invention is directed to a computer program product for modeling and simulating a powergated hierarchical element of an integrated circuit, the computer program product comprising: a computer usable medium having computer usable program code embodied therein, the computer usable medium comprising: computer usable program code configured to: model only a latch of the powergated macro as being powergated through an integrated switch; and model a first fence circuit that includes a first fence control signal and is attached to the powergated macro as including a second different fence control signal.

A fourth aspect of the invention is directed to a method for deploying an application for modeling and simulating a powergated hierarchical element of an integrated circuit, the method comprising: providing a computer infrastructure operable to: model only a latch of the powergated macro as being powergated through an integrated switch; model a first fence circuit that includes a first fence control signal and is attached to the powergated macro as including a second different fence control signal; model a structure of a hierarchical unit that includes the powergated macro in a manner that an output of the integrated switch is input into a second macro of the hierarchical unit to control a latch and a fence circuit attached to the second macro; and communicate a result of the simulation to a user of the simulation.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE SEVERAL VIEWS OF THE DRAWINGS

The embodiments of this invention will be described in detail, with reference to the following figures, wherein like designations denote like elements, and wherein.

DETAILED DESCRIPTION OF THE INVENTION

The following detailed description of embodiments refers to the accompanying drawings, which illustrate specific embodiments of the invention. Other embodiments having different structures and operations do not depart from the scope of the present invention.

1. Definitions

A hierarchical element refers to any component of a design of an integrated circuit.

A macro refers to any hierarchical element of a design of an integrated circuit, which is not a leaf level element.

A hierarchical unit refers to a macro that includes another macro, for illustrative purpose only.

A leaf level element includes a gate (NAND gate or latch) or a transistor.

A logic is a subset of connected hierarchical elements. The hierarchical elements include leaf level elements, either combinational (e.g. NAND gate) or sequential (e.g. latch), or both. The connected hierarchical elements may also include a macro.

A virtual ground is a net connected to the drain terminal of an integrated switch which is placed between the ground terminal of powergated hierarchical elements and a chip ground.

A virtual power is a net connected to the drain terminal of an integrated switch which is placed between a chip Vdd supply and the Vdd terminals of powergated hierarchical elements.

2. Computer System

Figure 3:
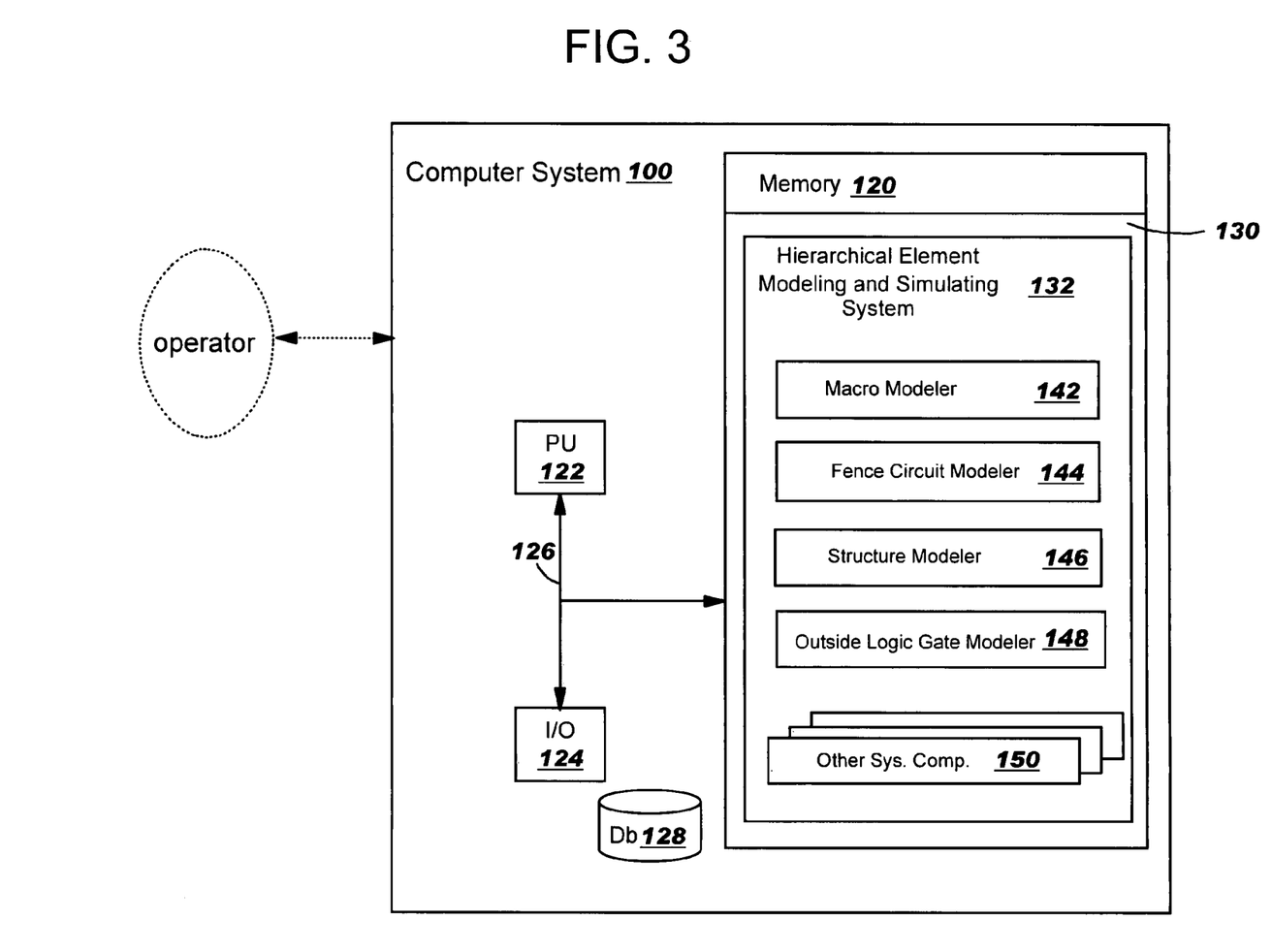
FIG. 3 shows a block diagram of an illustrative computer system 100 according to the present invention.

Referring to FIG. 3, a block diagram of an illustrative computer system 100 according to the present invention is shown. In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130 that, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 3, program product 130 may include a hierarchical element modeling and simulating system 132 that includes a macro modeler 142; a fence circuit modeler 144; a structure modeler 146; an outside logic gate modeler 148; and other system components 150. Other system components 150 may include any now known or later developed parts of a computer system not individually delineated herein, but understood by those skilled in the art.

Computer system 100 is responsive to an operator during the operation of hierarchical element modeling and simulating system 132. For example, the operator may apply stimulus for a hierarchical element of an integrated circuit into computer system 100, which are utilized by hierarchical element modeling and simulating system 132 in a simulating/modeling operation. The results of the simulation might be feedback to the operator for him/her to revise/conform a design of the hierarchical element simulated. The operation of hierarchical element modeling and simulating system 132 will be described in details below.

3. Hierarchical Element Modeling and Simulating System

Hierarchical element modeling and simulating system 132 functions generally to model and simulate a behavior of a powergated hierarchical element of an integrated circuit. One embodiment of the operation of hierarchical element modeling and simulating system 132 is shown in the flow diagram of FIG. 4. However, a brief description of a hierarchical element design as a background will be helpful for an understanding of the operation shown in FIG. 4.

The design and modeling of a VLSI chip usually starts at a very high level (top-down design) such as the architectural level and is refined in stages until the design is implemented in hardware, although a bottom-up type of design is also possible. An architectural level description does not typically contain detailed functions of the design that describe the design and thus can be used to implement the design. The highest level of description where the functions of a chip are described in enough detail to allow its implementation is typically referred to as the register-transfer level or RTL. RTL descriptions are usually implemented using languages such as VHDL or Verilog. Although higher level descriptions, such as algorithmic or unscheduled descriptions are possible and are used in a chip design, RTL descriptions are most common, especially for the state-of-the-art processor designs. As such, in the following description of the embodiments, RTL modeling of a hierarchical element including a powergated logic using VHDL as the language is used for illustration. It should be understood that the present invention also include using other simulation languages such as Verilog.

Although a design of a hierarchical element might be top-down, a modeling of the same does not need to be. In the following description, modeling of a hierarchical element is illustrated as beginning with modeling a powergated macro. However, it should be understood that the current invention is not limited by the specific order of modeling different levels of design of a hierarchical element. It should also be understood that even though the modeling is being described at the macro level and the next higher level which includes the macro (which is referred to as a hierarchical unit, for illustrative purpose), the same modeling technique is applicable at any level of a hierarchical description of a design. In other word, the word "macro" as used in the following description may include any level of a hierarchical element of a design, except for the leaf level element In the practice of chip design, an algorithmic description of a hierarchical element comes before a gate level implementation of the same, and the present invention may be used with an algorithmic description only, as will be shown below. In other words, a gate level implementation is not necessary to a modeling and/or simulation using the present invention. However, to facilitate an understanding of the present invention, gate level implementations of powergating included in a hierarchical element design will be provided, for illustrative purpose.

Figure 5:
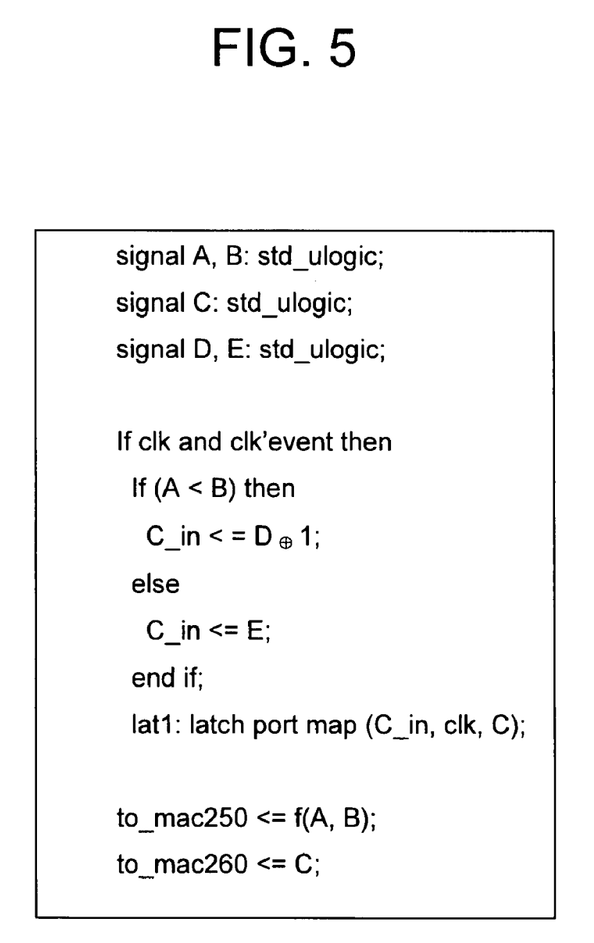
FIG. 5 shows a RTL VHDL description of a macro according to the present invention.
Figure 6:
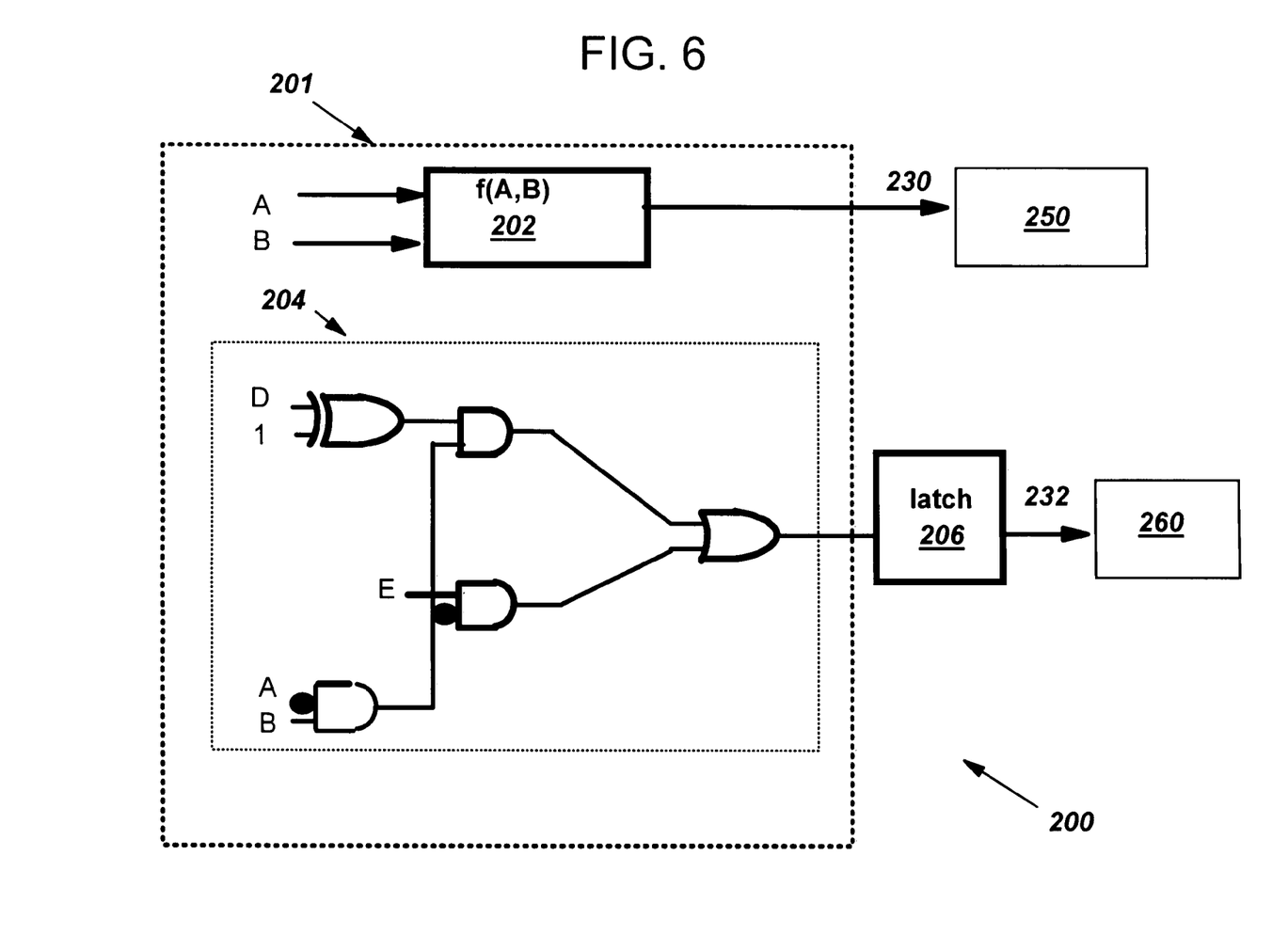
FIG. 6 shows a gate-level description of the RTL VHDL description of the macro of FIG. 5 according to the present invention.

For illustration of the problem, an RTL VHDL description of a macro is shown in FIG. 5. Please note, f(A,B) is a function for which the detailed logic description is omitted for simplicity. This VHDL description is translated into an equivalent gate-level description shown in FIG. 6. The gate-level description of FIG. 6 is more difficult to implement and understand than the behavioral style description in FIG. 5. However the gate-level description of FIG. 6 is closer to a hardware implementation and can be refined further to generate a hardware implementation. Integrated circuit designers typically design the hierarchical elements using behavioral style VHDL as shown in FIG. 5 since it is easy for a person to understand, implement and verify using methods such as a simulation.

As shown in FIG. 6, macro 200 includes a combinational logic 201 which includes two functions 202 and 204, wherein function 204 is shown in details for illustration; and a latch 206. The output of function 202 becomes output 230 of macro 200 that is input into a non-powergated macro 250. The output of function 204 is fed into latch 206. The output 232 of latch 206 is an output of macro 200, which is input into another powergated macro 260.

Figure 4:
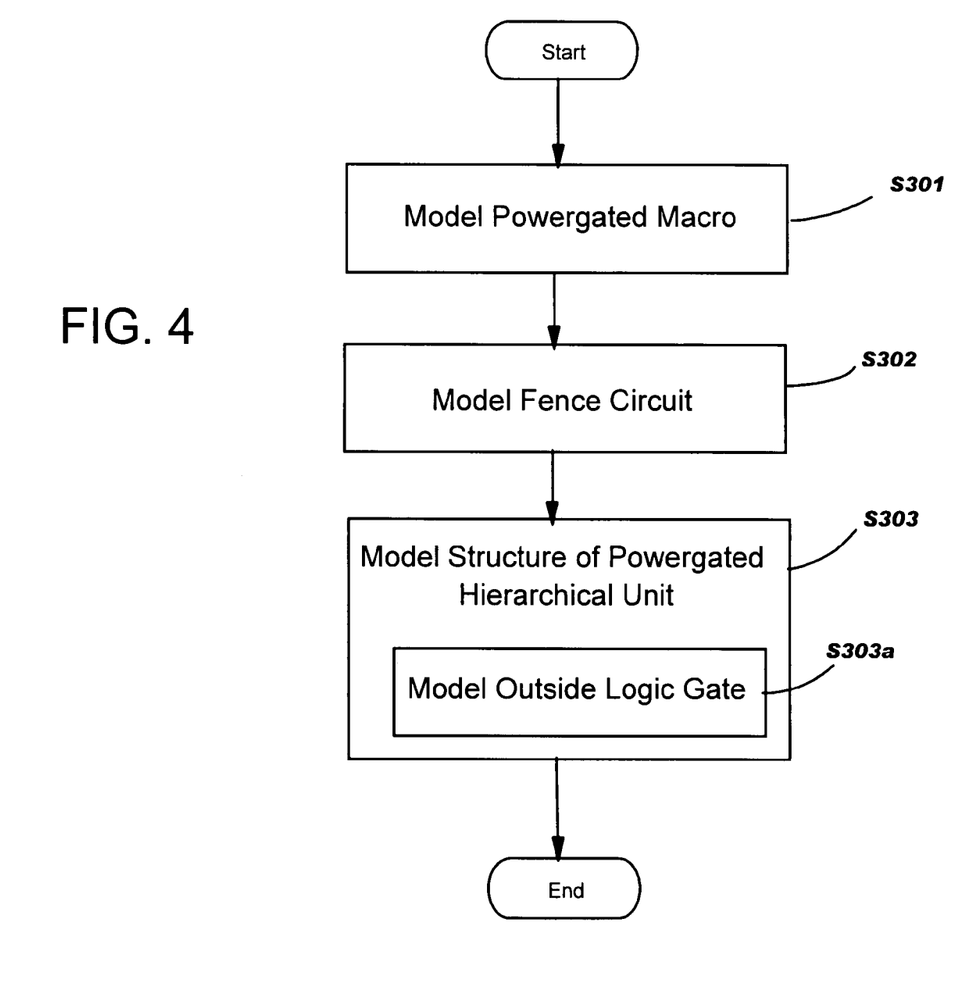
FIG. 4 shows one embodiment of the operation of a hierarchical element modeling and simulating system according to the present invention.
Figure 7:
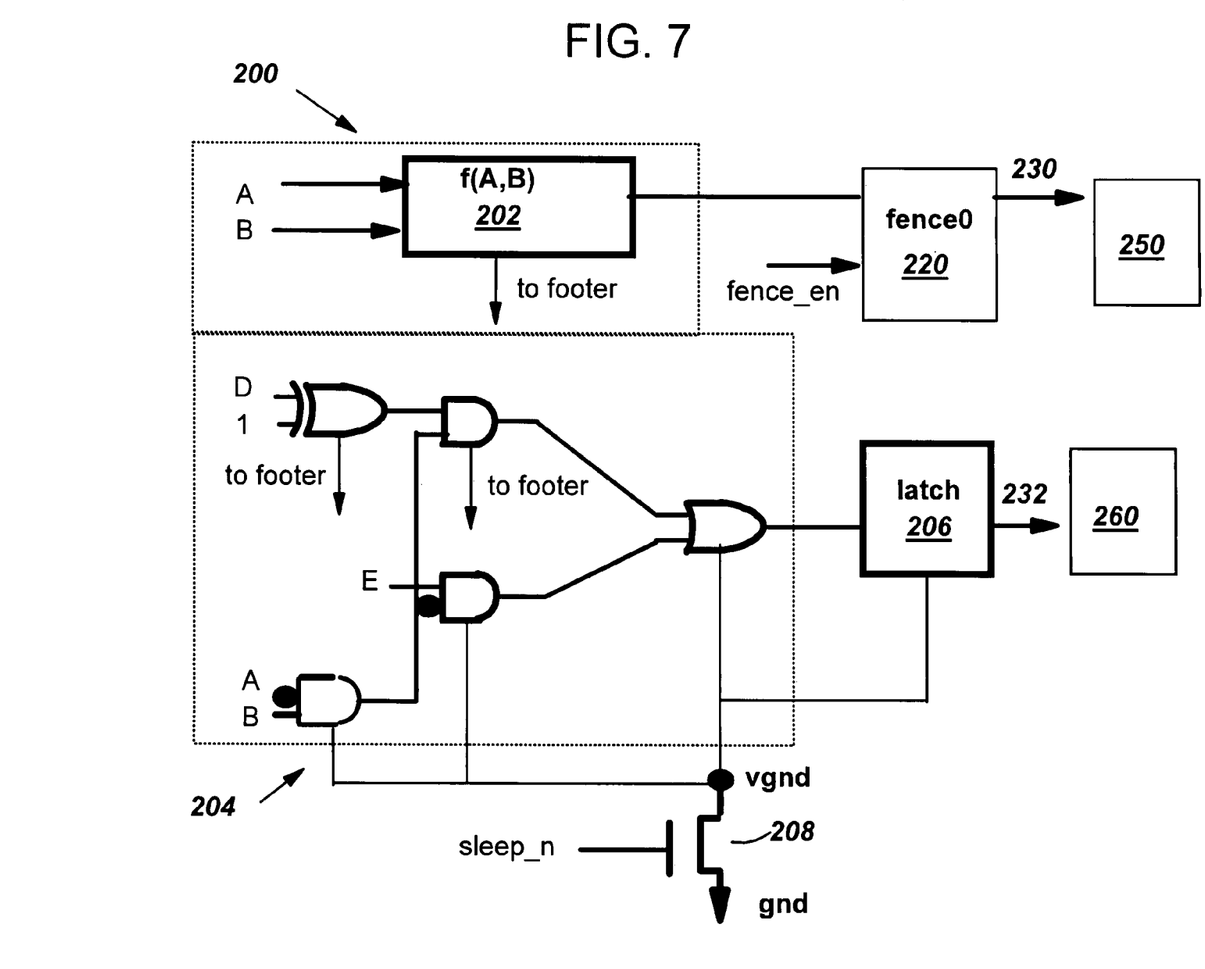
FIG. 7 shows the same macro of FIG. 6 except that all gates and latches are connected to a footer to be powergated and a fence circuit is added, according to the present invention.

FIG. 7 shows the same macro 200 of FIG. 6 except that all gates and latches are connected to a footer 208, i.e., powergated. In the following description, footer 208 is used to illustrate powergating for simplicity. However, it should be understood that the present invention as disclosed herein similarly applies to modeling and simulating powergated hierarchical elements using a header or any other dynamically controlled integrated switch. In addition, because output 230 is input into non-powergated macro 250, a fence circuit 220 is attached to the output of function 202 to avoid the problems associated with a floating output. In implementation, as shown in FIG. 7, fence circuit 220 is not powergated, e.g., connected to footer 208. Modeling of powergated macro 200 of FIG. 7 will be described with the embodiment of the operation of hierarchical element modeling and simulating system 132 as shown in FIG. 4. In the following description, it should also be understood that all descriptions of FIGS. 5-6 also apply to FIG. 7, except for the features specific to FIG. 7.

Figure 8:
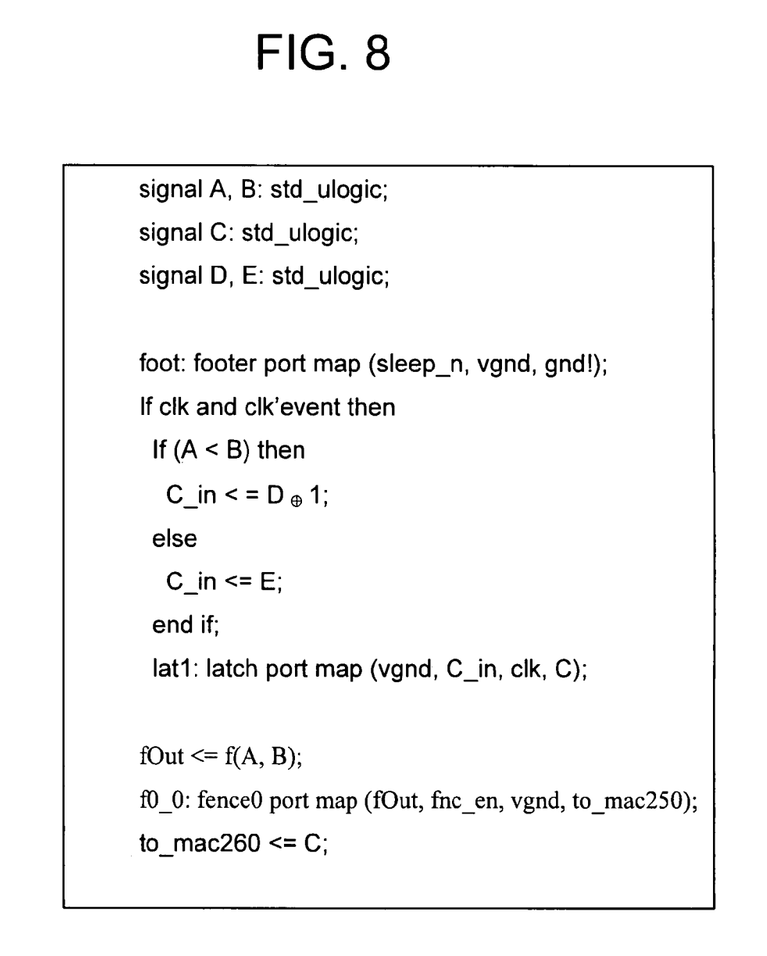
FIG. 8 shows an illustrative VHDL coding of a modeling of the powergated macro and the fence circuit of FIG. 7 according to one embodiment of the present invention.
Figure 9:
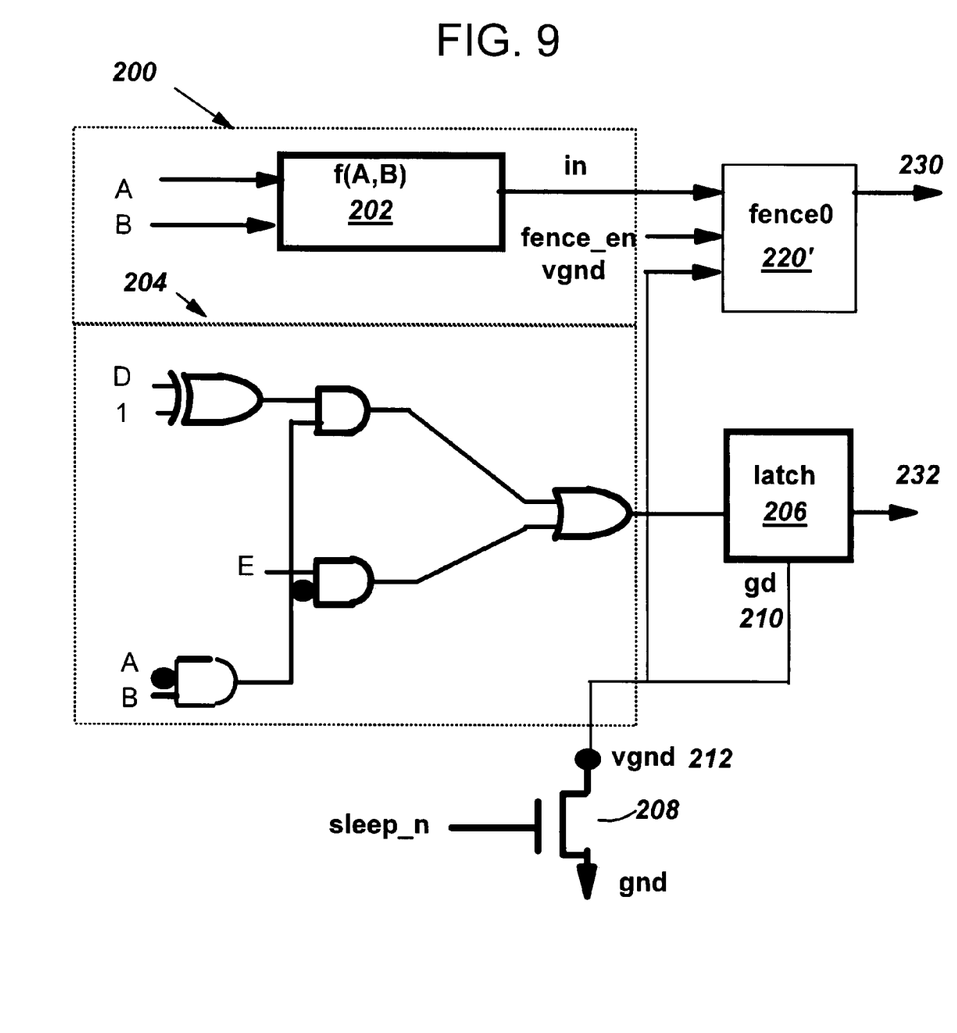
FIG. 9 shows a gate level implementation of the modeling of FIG. 8 according to the present invention.

Referring back to FIG. 4, in step S301, macro modeler 142 models powergated macro 200 of FIG. 7. Specifically, macro modeler 142 models only latch 206 as powergated, but model functions 202 and 204 as non-powergated. FIG. 8 shows an illustrative VHDL coding of, inter alia, the modeling of powergated macro 200. FIG. 9 shows a gate level implementation of the modeling. As shown in FIG. 9, specifically, latch 206 is modeled as having a ground pin or "gd" 210 connected to the virtual ground or "vgnd" net 212. This "gd" pin is extra because a latch in non-powergated RTL models do not need or have a "gd" pin. As a consequence, when footer 208 is activated, i.e., the powergating in macro 200 is turned on, the output of footer 208 goes from 0 to a non-zero powergated state, "X", and the state of latch 206 is forced to "X".

Please note, a powergated state of "X" will be used throughout this disclosure. However, in certain cases, it may be appropriate to introduce more powergated states, such as "Z". For example, an implementation might implement the powergated state as "Z" which can be interpreted as a high impedance state. In the same implementation, when powergating is turned on, and immediately after powergating is turned off, latch states can be modeled as "X", which can be interpreted as modeling a value of either 0 or 1. The powergated state will be referred to as "X" in the remainder of this document, for simplicity and illustrative purpose.

The modeling of macro 200 as shown in FIG. 9 correctly represents the behavior of it with respect to powergating for the reasons that follow. When macro 200 of FIG. 7 is powergated, the outputs of function 204 and latch 206 all go into a floating state ("X"). In the simulation model of FIG. 9, because function 204 is not modeled as powergated, the output of it will not go into the floating state "X". However, because latch 206 is powergated, when footer 208 is activated, the output of footer 208 goes to "X" which is input into latch 206 through ground pin 210 and "force" the state of latch 206 into the powergated state "X". As such, although the simulation model of FIG. 9 does not correctly model the behavior of function 204, a correct modeling of latch 206 is sufficient for a RTL verification of the powergated macro 200.

Referring back to FIG. 4, with reference also to FIG. 9, next in step 302, fence circuit modeler 144 models fence circuit 220 that is attached to function 202 of powergated macro 200. Specifically, according to one embodiment, fence circuit 220 is modeled as including an additional control signal (vgnd) in addition to the fence control signal (fenc_en). The additional control signal (vgnd) inputs a powergated state of function 202, "X", into fence circuit 220. According to one embodiment, the output of footer 208, vgnd, is input into fence circuit 220 as the additional control signal. An illustrative coding of circuit 220 modeling is shown in FIG. 8 and the corresponding gate level implementation is shown in FIG. 9. Please note, in FIG. 9, the fence circuit is marked as 220' to represent the addition of an extra vgnd input.

Figure 10:
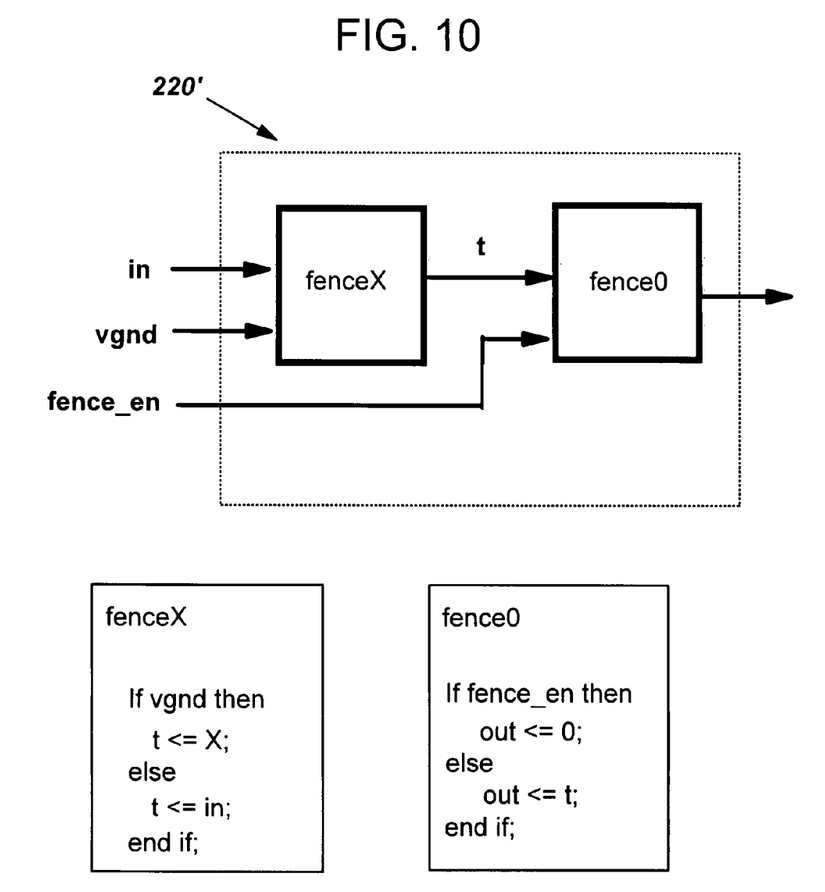
FIG. 10 shows details of the modeled fence circuit, including a schematic view of the implementation and the coding, according to one embodiment of the present invention.

FIG. 10 shows details of the modeled fence circuit 220', including a schematic view of the implementation and the coding. As shown in FIG. 10, the modeled fence circuit 220' includes actually two fence circuits attached together in a manner that a fenceX is put before a fence0. When the additional control signal, here vgnd, is activated, the powergated state of function 202, i.e., "X", is forced to fence0, as what will happen to fence circuit 220 of FIG. 7, as will be shown in details below.

The modeling of fence circuit 220 as shown in FIG. 9 correctly represents the performance of macro 200 and fence circuit 220 with respect to powergating for the reasons that follow. When function 202 is powergated (FIG. 7), its output goes into a powergated state "X", which is input into fence circuit 220. In the modeling of macro 200 and fence circuit 220 shown in FIG. 9, function 202 is not modeled as powergated and will not output a powergated state "X" to fence circuit 220'. However, in FIG. 9, when footer 208 is activated, the footer 208 output, vgnd, becomes non zero, which forces a powergated state "X" of function 202 into fence circuit 220', specifically fence0 of fence circuit 220' as described in FIG. 10. As such, although the simulation model of FIG. 9 does not correctly model the behavior of function 202, the proposed modeling of fence circuit 220 is sufficient for a RTL verification of powergated macro 200 and fence circuit 220.

The modeling style as shown in FIG. 9, which may be referred to as an implicit style modeling, has at least the following advantages: (a) it allows an easy to understand behavioral style description of a powergated macro at RTL; (b) only latch elements and/or fence circuit elements in the VHDL library require extra terminals for the power pins, and the rest of the logic gate VHDL models do not require extra terminals, which makes the coding and description simple; and (c) a simulation of the implicit style model is faster than a detailed model.

Figure 11:
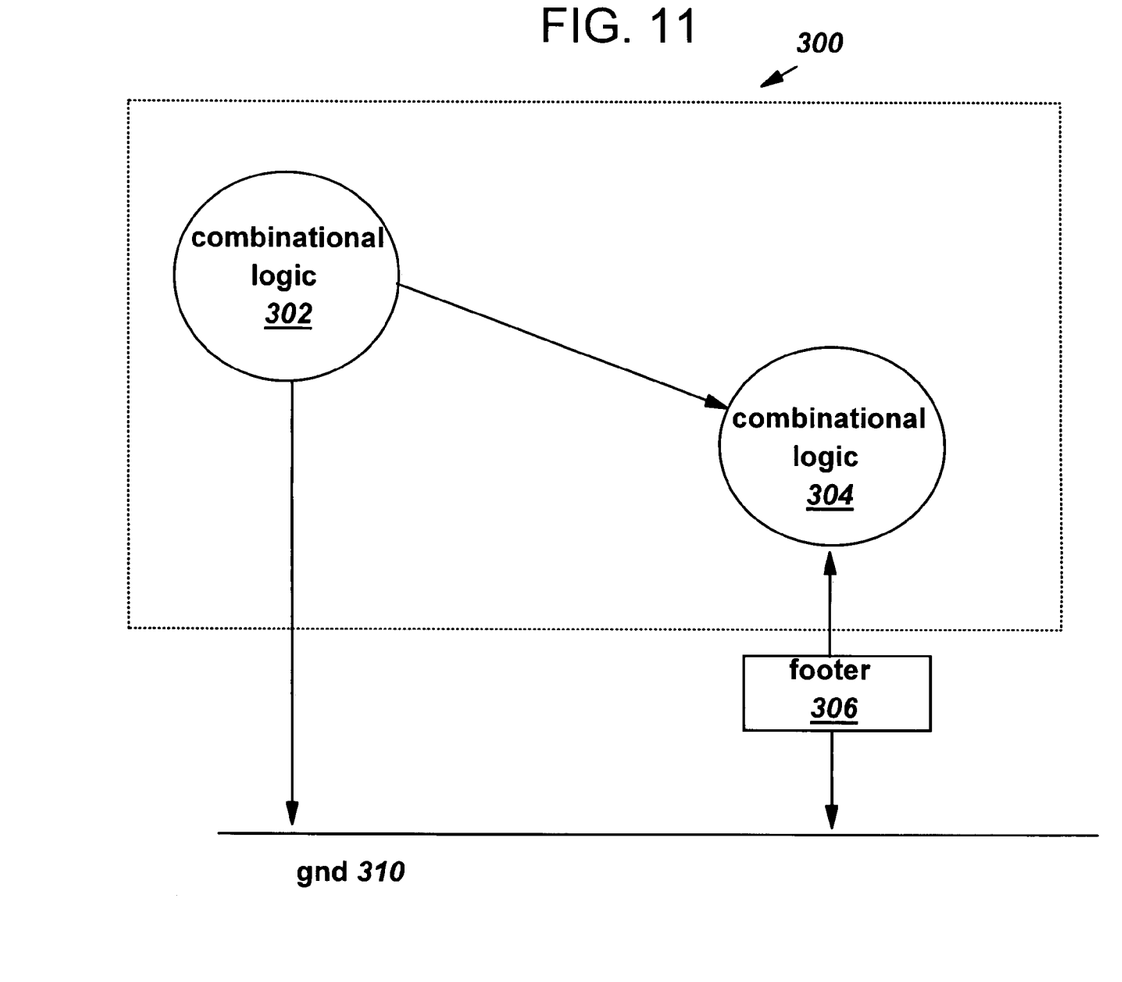
FIG. 11 shows an alternative embodiment of a powergated macro according to the present invention.
Figure 12:
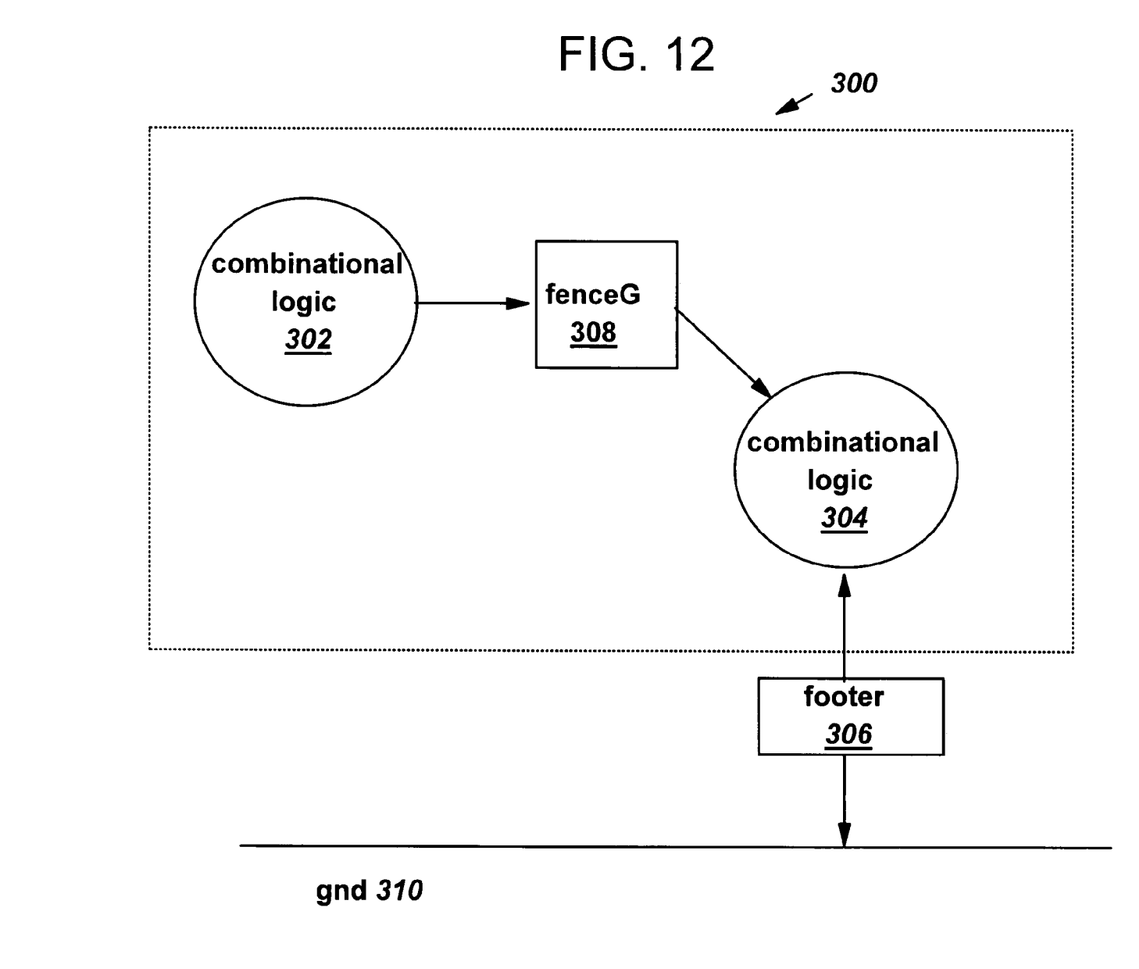
FIG. 12 shows an embodiment of modeling the powergated macro of FIG. 11 according to the present invention.

In the above described embodiment, all logic gates of the illustrative powergated macro 200 of FIG. 7 are connected to virtual ground 212, i.e., powergated. However, in practice, a powergated macro may include logic gates that are implicitly connected to the chip ground instead of the virtual ground, as represented by powergated macro 300 of FIG. 11. In FIG. 11, combinational logic 302 is connected to chip ground 310, while combinational logic 304 is connected to footer 306. Based on the previous description of FIGS. 8-9, it should be understandable that modeling a powergating behavior of macro 300 does not require any change to the RTL model as represented in FIGS. 8-9, because a combinational logic in the implicit model of FIG. 9 will always behave like a non-powergated logic gate. However, to correctly synthesize a description from the RTL code, some annotation is required to identify combinational logic 302 as connecting to chip ground. According to one embodiment, macro modeler 142 (FIG. 3) models combinational logic 302 as including a fenceG circuit 304 attached to the output of combinational logic 302, as shown in FIG. 12. FenceG circuit 308 behaves as a buffer, i.e., the output of fenceG circuit 308 is always the same as its input. FenceG circuit 308 also behaves as a marker for a synthesis tool so that when the synthesis tool detects a fenceG circuit (308) in a powergated macro 300, it understands that combinational logic 302 attached to the input of fenceG 308 needs to be associated with a chip ground instead of a virtual ground.

Referring back to FIG. 4, next in step S303, structure modeler 146 models a structure of a powergated hierarchical unit. A hierarchical unit is a unit of a design which instantiates macros and logic gates. According to one embodiment, if a hierarchical unit instantiates logic gates in addition to macro instantiations, i.e., including logic gates outside macros, in step S303a of step S303, structure modeler 146 controls outsider logic gate modeler 148 (FIG. 3) to model the outside logic gates as logic gates inside a powergated macro. As a consequence, according to one embodiment, structure modeler 146 models a power gated hierarchical unit with only macros.

Figure 13:
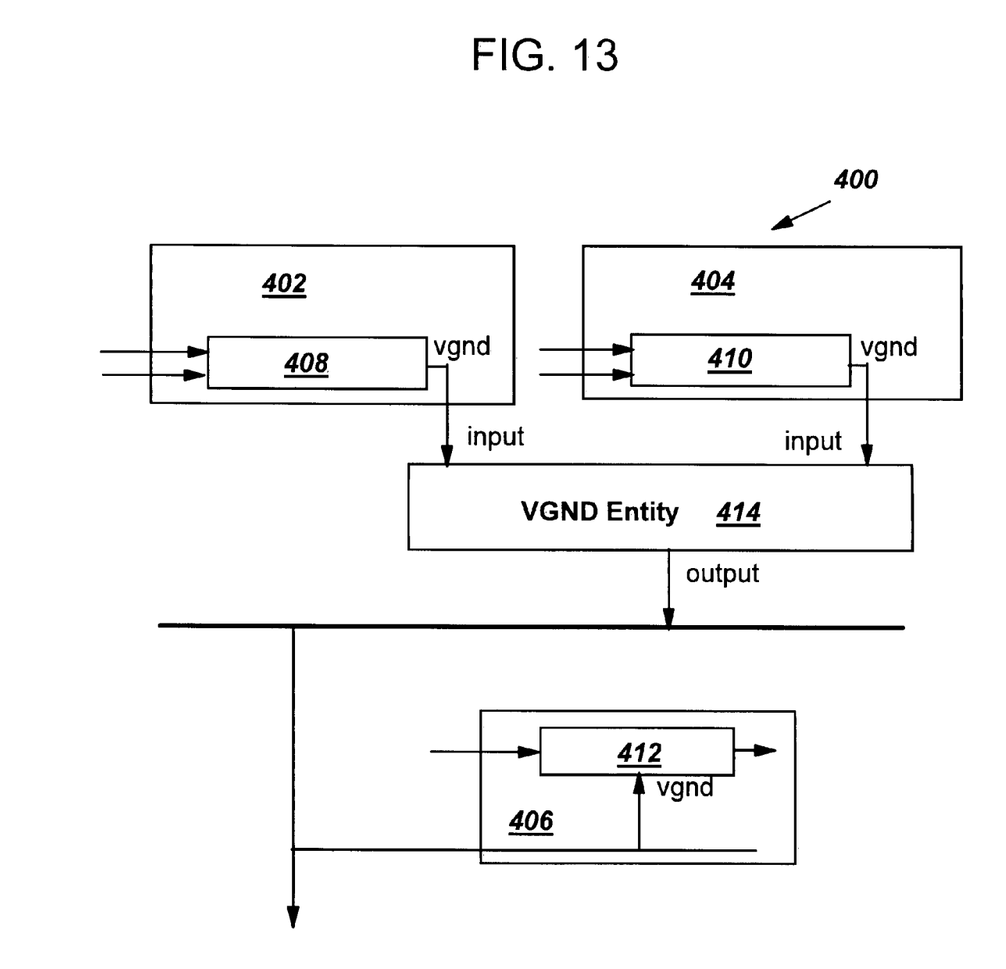
FIG. 13 shows an embodiment of modeling a structure of a powergated hierarchical unit according to the present invention.

According to one embodiment, in modeling a powergated hierarchical unit, a bidirectional pin labeled "vgnd" is introduced in the interface of each powergated macro as shown in FIG. 13. Please note that a powergated macro in a powergated hierarchical unit may not need to have a footer. Rather, a macro might have a footer output of a second macro as an input to share the footer of the second macro. Inside each powergated macro, the "vgnd" pin is connected to the footer output, if the macro has a footer. If a powergated macro does not have a footer, then the "vgnd" pin is used to drive the ground pin of latches and fence circuits in a manner as shown in FIG. 9. Also, all macros in the same powergated hierarchical unit have their vgnd pins tied to a unit level vgnd net. It should be understood that in this embodiment, the unit level vgnd net could have multiple sources, and will require a resolution function which may be implemented by using the std_logic data type in VHDL. However, using std_logic data type may slow down a simulation and may create problems in synthesis.

To avoid the problems of using std_logic data, FIG. 13 shows an alternative embodiment of modeling a structure of a powergated hierarchical unit 400. As shown in FIG. 13, hierarchical unit 400 includes three macros 402, 404 and 406. Macros 402 and 404 include footers 408 and 410, respectively, while macro 406 does not include a footer. Macros 402 and 404 that are footered are modeled to have a "vgnd" pin attached to the outputs of footers (408 and 410), which are connected to a vgnd entity 414 at the unit level. Macro 406 that does not have a footer has a vgnd pin as an input. At the unit level, vgnd entity 414 is instantiated and the vgnd outputs of all footered macros (here, 402 and 404) are connected as inputs to vgnd entity 414. Vgnd entity 414 has an output which is connected to the vgnd pin (input) of macro 406. In macro 406, vgnd pin acts as a footer output, and drives the ground pin of latches and the sleep control input of modified fence circuits in a manner as shown in FIG. 9. Vgnd entity 414 can have any resolution function implemented inside. Moreover, the vgnd pins are of type input or output and not of type bidirectional. As such, it is not required to use a std_logic type for the signals, which simplifies simulation and synthesis.

4. Conclusion

While shown and described herein as a method and system for simulating a powergated hierarchical element of an integrated circuit, it is understood that the invention further provides various alternative embodiments. For example, in one embodiment, the invention provides a program product stored on a computer-readable medium, which when executed, enables a computer infrastructure to simulate a powergated hierarchical element of an integrated circuit. To this extent, the computer-readable medium includes program code, such as hierarchical element modeling and simulating system 132 (FIG. 3), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 3) and/or database 128 (FIG. 3), and/or as a data signal traveling over a network (e.g., during a wired/wireless electronic distribution of the program product).

In another embodiment, the invention provides a method of generating a system for simulating a powergated hierarchical element of an integrated circuit. In this case, a computer infrastructure, such as computer system 100 (FIG. 3), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 3), from a computer-readable medium; (2) adding one or more computing devices to the computer infrastructure; and (3) incorporating and/or modifying one or more existing systems of the computer infrastructure, to enable the computer infrastructure to perform the process steps of the invention.

In still another embodiment, the invention provides a business method that performs the process described herein on a subscription, advertising, and/or fee basis. That is, a service provider could offer to model and simulate a powergated hierarchical element of an integrated circuit as described herein. In this case, the service provider can manage (e.g., create, maintain, support, etc.) a computer infrastructure, such as computer system 100 (FIG. 3), that performs the process described herein for one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method for deploying an application for modeling and simulating a powergated hierarchical element of an integrated circuit, the method comprising: providing a computer infrastructure operable to:

model only a latch of the powergated macro as being powergated through an integrated switch;

model a first fence circuit that includes a first fence control signal and is attached to the powergated macro as including a second different fence control signal;

model a structure of a hierarchical unit that includes the powergated macro in a manner that an output of the integrated switch is input into a second macro of the hierarchical unit to control a latch and a fence circuit attached to the second macro; and communicate a result of the modeling and simulation to a user of the simulation.

2. The method of claim 1, the integrated switch being modeled in a manner that when the integrated switch is activated, a powergated state of the powergated macro is input into the latch and the first fence circuit as the second different fence control signal.

3. A method for modeling and simulating a powergated hierarchical element of an integrated circuit, the powergated hierarchical element including a powergated macro and a powergated latch electrically connected to an output of the powergated macro the method comprising:

modeling only the latch as being powergated through an integrated switch, wherein the latch modeling includes modeling the integrated switch as being controlled by an integrated switch control signal to input a powergated state of the powergated macro into the latch when the integrated switch is activated.

4. The method of claim 3, further including modeling a logic gate of the powergated macro as including a fence circuit attached to an output of the logic gate to act as a buffer and to identify the logic gate in a synthesis of the model as being connected to a chip ground as opposed to a virtual ground.

5. The method of claim 3, further including modeling a leaf-level element not included in the powergated macro but included in a hierarchical unit that includes the powergated macro as being included in the powergated macro.

6. The method of claim 3, further including a step of modeling a structure of a hierarchical unit that includes the powergated macro in a manner that an output of the integrated switch is input into a second macro of the hierarchical unit to control a latch and a fence circuit attached to the second macro.

7. The method according to claim 3, wherein the powergated hierarchical element further includes a fence circuit electrically connected to an output of the powergated macro, the fence circuit including a first fence control signal, and the method further comprises:

modeling the first fence circuit as including a second different fence control signal, the second fence control signal being provided through the integrated switch as the powergated state of the powergated macro when the integrated switch is activated.

* * * * *